US007652288B2

(12) United States Patent
Chu et al.

(10) Patent No.: US 7,652,288 B2
(45) Date of Patent: Jan. 26, 2010

(54) EPITAXIAL AND POLYCRYSTALLINE GROWTH OF $SI_{1-X-Y}GE_XC_Y$ AND $SI_{1-Y}C_Y$ ALLOY LAYERS ON SI BY UHV-CVD

(75) Inventors: Jack O. Chu, Manhasset Hills, NY (US); Basanth Jaqannathan, Beacon, NY (US); Alfred Grill, White Plains, NY (US); Bernard S. Meyerson, Yorktown Heights, NY (US); John A. Ott, Greenwood Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 12/163,389

(22) Filed: Jun. 27, 2008

(65) Prior Publication Data

US 2009/0026459 A1  Jan. 29, 2009

Related U.S. Application Data

(60) Continuation of application No. 11/618,770, filed on Dec. 30, 2006, now Pat. No. 7,405,422, which is a continuation of application No. 10/775,514, filed on Feb. 10, 2004, now Pat. No. 7,183,576, which is a division of application No. 09/838,892, filed on Apr. 20, 2001, now Pat. No. 6,750,119.

(51) Int. Cl.
 *H01L 29/00* (2006.01)
(52) U.S. Cl. ........................... 257/65; 257/77; 257/592; 257/E29.193; 257/15
(58) Field of Classification Search .................. 257/65, 257/77, 592, E29.193
See application file for complete search history.

(56) References Cited

U.S. PATENT DOCUMENTS

| 5,061,972 A | 10/1991 | Edmond |
| 5,225,371 A | 7/1993 | Sexton et al. |
| 5,296,258 A | 3/1994 | Tay et al. |
| 5,683,934 A | 11/1997 | Candelaria et al. |

(Continued)

OTHER PUBLICATIONS

E. Kasper, et al., "Growth of 100 Ghz SiGe-Heterobiploar Transistor (HBT) Structures," Jpn. J. App. Phys., Apr. 1994, pp. 2415-2418, vol. 33 Pt. 1, No. 4B.

(Continued)

*Primary Examiner*—Tu-Tu V Ho
(74) *Attorney, Agent, or Firm*—Scully, Scott, Murphy & Presser, P.C.; Louis J. Percello, Esq.

(57) ABSTRACT

A method and apparatus for depositing single crystal, epitaxial films of silicon carbon and silicon germanium carbon on a plurality of substrates in a hot wall, isothermal UHV-CVD system is described. In particular, a multiple wafer low temperature growth technique in the range from 350° C. to 750° C. is described for incorporating carbon epitaxially in Si and SiGe films with very abrupt and well defined junctions, but without any associated oxygen background contamination. Preferably, these epitaxial SiC and SiGeC films are in-situ doped p- or n-type and with the presence of low concentration of carbon $<10^{20}$ cm$^{-3}$, the as-grown p- or n-type dopant profile can withstand furnace anneals to temperatures of 850° C. and rapid thermal anneal temperatures to 1000° C.

18 Claims, 11 Drawing Sheets

U.S. PATENT DOCUMENTS

| | | |
|---|---|---|
| 5,906,680 A | 5/1999 | Meyerson |
| 6,049,098 A | 4/2000 | Sato |
| 6,114,745 A | 9/2000 | Fang et al. |
| 6,137,120 A | 10/2000 | Shindo et al. |
| 6,190,975 B1 | 2/2001 | Kubo et al. |
| 6,306,211 B1 | 10/2001 | Takahashi et al. |
| 6,459,107 B2 * | 10/2002 | Sugiyama et al. ........... 257/226 |
| 6,552,375 B2 | 4/2003 | Swanson et al. |
| 6,958,253 B2 | 10/2005 | Todd |
| 2002/0016085 A1 | 2/2002 | Huang et al. |
| 2002/0094658 A1 | 7/2002 | Swanson et al. |
| 2002/0160605 A1 | 10/2002 | Kanazawa et al. |

OTHER PUBLICATIONS

H.J. Osten et al., "Carbon Doped SiGe Heterojunction Bipolar Transistors for High Frequency Application," IEEE BCTM 7.1, 1999, pp. 109-116.

* cited by examiner

EPITAXIAL AND POLYCRYSTALLINE GROWTH OF $SI_{1-X-Y}GE_XC_Y$ AND $SI_{1-Y}C_Y$ ALLOY LAYERS ON SI BY UHV-CVD

CROSS-REFERENCE TO RELATED APPLICATION

This application is a continuation of U.S. application Ser. No. 11/618,770, filed Dec. 30, 2006, which is a continuation of U.S. application Ser. No. 10/775,514 filed Feb. 10, 2004, now U.S. Pat. No. 7,183,576, issued on Feb. 27, 2007, which is a divisional of U.S. application Ser. No. 09/838,892, filed Apr. 20, 2001, which is now U.S. Pat. No. 6,750,119, issued Jun. 15, 2004.

Cross-reference is made to U.S. patent application Ser. No. 09/774,126 filed Jan. 30, 2001, which is now U.S. Pat. No. 6,426,265 by Chu et al. entitled "Incorporation of Carbon in Silicon/Silicon Germanium epitaxial layer to Enhance Yield for Si—Ge bipolar technology" which is directed to a method of fabricating a SiGe bipolar transistor including carbon in the collector region as well as the SiGe base region and which is assigned to the assignee herein and incorporated herein by reference.

FIELD OF THE INVENTION

This invention relates to silicon-carbon and silicon germanium-carbon based materials system and more specifically, to a novel method and apparatus for depositing single crystal and poly crystalline layers of silicon-carbon (Si:C) and silicon germanium-carbon (SiGe:C) on a plurality of substrates at low temperatures and low pressures. A multiple wafer, low temperature growth technique is described for incorporating carbon epitaxially into Si and SiGe with very abrupt and well defined junctions, without any associated oxygen background contamination. Preferably, these silicon carbon alloy films are device quality, epitaxial layers which can be in-silicon-carbon and silicon germanium-carbon layers to form the base region of a high speed heterojunction bipolar transistor (HBT). The incorporation of a low concentration of carbon <$10^{20}$ atoms cm$^{-3}$ into the SiGe base region of a HBT can suppress boron outdiffusion and allow the use of high boron doping levels (>>$10^{19}$ cm$^{-3}$) in a very thin SiGe base region (<20 nm) without suffering the effects of boron out-diffusion from post-epitaxial thermal processing and anneals.

BACKGROUND OF THE INVENTION

The next generation of SiGe HBTs suitable for wireless telecommunication systems, which operate at radio or microwave frequencies will be designed and targeted for very high speed SiGe bipolar devices having $f_T$ and $f_{max}$ of over 100 GHz. Presently, state of the art SiGe-base heterojunction bipolar transistors (HBT's) employ a graded SiGe structure to introduce an accelerating field across the base region in order to achieve high frequency performance from 45 to 90 GHz. Hence, to achieve SiGe bipolar devices with $f_T$ and $f_{max}$ of over 100 GHz, another device enhancement or improvement will be required for the present graded SiGe based transistors. One possibility for performance enhancement is the scaling of the base width of the device, which is very difficult to achieve in manufacturing due to punch through of the base region. The key difficulty associated with base width scaling is in controlling the corresponding increase of the base doping to a high doping concentration to avoid punch through, which is very difficult to achieve in manufacturing. The effect of the base thickness on the high frequency performance of SiGe HBTs has been reported in a publication by E. Kasper et. al. entitled "Growth of 100 GHz SiGe-Heterobipolar Transistor (HBT) Structures", Jpn. J. Appl. Phys. Vol. 33 Pt. 1, No. 4B, April 1994, pp. 2415-2418 which is incorporated herein by reference. The reference showed a steady increase of $f_T$ with the decreasing of the SiGe-base thicknesses. For example, starting with HBT's with a 65 nm base thickness which did not exceed 20 GHz, transistors with a thinner 40 nm base width had yielded 37-52 GHz, while devices with even thinner 28-30 nm bases had exhibited even higher $f_T$ in the range of 58-91 GHz. Moreover, when the effective base thickness was further scaled down below 50% to a 25 nm or 22 nm base thickness an extremely high $f_T$ of 95-100 Hz was achieved corresponding to a n increase of 4-5 times in $f_T$ and demonstrating the influence of base thickness on the speed of the bipolar transistor. However, it is important to note that in these very narrow base SiGe transistors the base doping concentration was in the extremely high range of about $8 \times 10^{19}$ boron/cm$^3$ which is necessary in order to maintain a base sheet resistance of about 1.2 K-Ohm in such a thin 20 nm base region without punchthrough.

Subsequently, in order to combine and benefit from both these critical device enhancements for high speed performances in the present SiGe npn bipolar transistors, very high Ge content and more importantly very high boron doping concentration will be required in a thinner base region to achieve lower base sheet resistance and higher $f_{max}$ transistor performance. A heavily doped SiGe base profile will effectively have a smaller band gap in the strained SiGe base offering a lower barrier for electron injection into the base and importantly, maintaining a lower base resistance and shorter transit time with the use of a thinner and highly doped boron doped SiGe base structure. However, such a thin heavily doped SiGe layered structure is very susceptible to dopant out-diffusion or re-distribution due to high concentration gradients during thermal treatments in the manufacturing process. In fact, one of the key problems in the present SiGe npn BiCMOS technology of one major manufacturer is to retain the narrow as-grown boron profile within the SiGe base layer and eliminate the undesirable out-diffusion of boron from the base region caused by heat treatments or transient enhanced diffusion (TED) from post-epitaxial processing of annealing implantation damages and CMOS integrations. Unfortunately, out diffusion of boron does present a severe problem since it limits the final achievable base-width in the base of the bipolar transistor regardless of how narrow the base-width may have been originally generated. Moreover, in cases where the boron diffuses or extends outside of the SiGe base region this can cause undesirable conduction band barriers to be formed at the base-collector junction which will degrade the collector current and subsequently the high frequency performance of the bipolar device.

The classic solution to this problem has been to accommodate the out-diffusion of boron rather than to resolve it, i.e. is to grow an extended undoped spacer of SiGe on either side of the doped base region between the emitter and collector regions. However, in such a case the technological problem then reverts back to minimizing and adjusting the thickness of the SiGe spacer layers in order to avoid strain-induced defect formation within the SiGe base structure. Moreover, even then, the thicknesses of the undoped spacer layers selected to alleviate or accommodate the out-diffusion problem is still restricted and limited by critical thickness considerations and there may not be suitable spacer layers to accommodate the out-diffusion of boron problem. The ideal solution to prevent or reduce the boron base dopant out-diffusion from occurring is a well known chemical effect that the presence or addition of carbon in a boron doped Si or SiGe layer can significantly reduce the out-diffusion of boron from the initial as-grown dopant profile. Moreover, H. J. Osten et. al., in the paper entitled "Carbon Doped SiGe Heterojunction Bipolar Transistors for High Frequency Applications", IEEE BCTM 7.1, 1999, pp 109-116, which is incorporated herein by reference, have recently shown that low carbon concentration ($<10^{20}$ atom.cm$^{-3}$) can significantly suppress boron out-diffusion without affecting the strain or band alignment and successful applications of carbon-rich layers for SiGe heterojunction bipolar transistors. Nevertheless, there exist a number of difficult material issues and problems associated with the growth of device quality SiC or SiGeC films. First, carbon has a very low equilibrium solid solubility in Si that is approximately $3.5 \times 10^{17}$ atoms.cm$^{-3}$ ($<10^{-3}$ atomic %) at its melting point and it is even lower at the typical growth temperatures <1000 C. Second, the presence of carbon contamination on a Si surface is know to disrupt the epitaxial growth and finally, there is a tendency to precipitate silicon carbide (beta-SiC) at high growth or annealing temperatures. Therefore, the biggest material problem is the ability to grow device quality Si:C and SiGe:C films at low temperatures, especially for the UHV-CVD process which is a fully manufacturable process currently being used in IBM's BiCMOS technology.

A prior technique of UHV-CVD for depositing and fabricating very thin epitaxial layers having abrupt transitions in dopant concentration between adjacent single crystal layers at low temperatures is described in U.S. Pat. No. 5,906,680 which issued on May 25, 1999 to B. S. Meyerson entitled "Method and Apparatus for Low Temperature, Low Pressure Chemical Vapor Deposition of Epitaxial Silicon Layers" and assigned to the assignee herein. In U.S. Pat. No. 5,906,680 an apparatus is described where the characteristic of the growth system is provided to have an ultrahigh vacuum integrity in the range of about $10^{-9}$ Torr prior to epitaxial deposition at temperatures of less than 800° C. Furthermore, the epitaxial silicon or silicon germanium layers can be doped in-situ to provide very abrupt defined regions of either n- or p-type conductivity. However, a suitable method for depositing silicon-carbon or silicon germanium-carbon by this technique has not yet been described.

The ability to grow and achieve high carbon concentrations in both device quality Si and SiGe films at low temperatures (<550° C.) has not been demonstrated by any other growth techniques or processes suitable for batch-size, manufacturing operations. There are, however, low temperature growth techniques such as molecular beam epitaxy (MBE), solid phase epitaxy regrowth and rapid thermal CVD (RT-CVD) which have been successfully employed to grow SiC and SiGeC layers with carbon levels up to 1%-3% carbon but often the material quality is not suitable for device applications.

SUMMARY OF THE INVENTION

In accordance with the present invention, an apparatus and process for achieving epitaxial silicon carbon and silicon germanium carbon films without the above mentioned problems is described, and in particular a manufacturable technique for batch processing of multiple wafers for the growth of expitaxial silicon carbon or silicon germanium carbon films thereon is provided. Furthermore, the fabrication of very thin epitaxial layers of silicon carbon or silicon germanium carbon having abrupt transitions of several atomic widths in carbon concentration between adjacent single crystal layers, which cannot be achieved by any prior art techniques, is provided. In the present invention, the temperatures and pressures of the growth technique are much less than those utilized in the prior art, and are such that the growth process is nonequilibrium in nature whereby the growth kinetics on the silicon containing surface, rather than the equilibrium thermodynamics of the inlet gases, dictate the deposition process. A hot wall, isothermal CVD apparatus as described in U.S. Pat. No. 5,906,680 is utilized whereby essentially no homogeneous gas phase pyrolysis of the silicon and/or carbon precursor such as silane or ethylene source gas occurs during the residence time, which is less than 1 second, within the selected temperature regime where the growth process is operated. Similar to U.S. Pat. No. 5,906,680 heterogeneous chemistry where kinetic reactions at the surface of the substrate occur by design of method and apparatus, are the primary determinants of epitaxial deposition of silicon carbon and silicon germanium carbon films.

It is a primary object of the present invention to provide a method and apparatus for performing epitaxial single crystal deposition of silicon carbon layers in a batch process.

It is a further object of the present invention to provide an apparatus and method for enabling low temperature epitaxy of silicon carbon layers having very low concentrations of oxygen contaminants in the SiC layers, preferably less than $1 \times 10^{17}$ O atoms cm$^{-3}$.

It is a further object of the present invention to provide an apparatus and method for enabling low temperature epitaxy of silicon carbon layers in the temperature range from 475° C. to 850° C.

It is a further object of the present invention to provide a method and apparatus for performing epitaxial single crystal deposition of silicon germanium carbon layers in a batch process.

It is a further object of the present invention to provide an apparatus and method for enabling low temperature epitaxy of silicon germanium carbon layers having very low concentrations of oxygen contaminants in the SiGeC layers, preferably less than $1 \times 10^{17}$ O atoms cm$^{-3}$.

It is a further object of the present invention to provide an apparatus and method for enabling low temperature epitaxy of silicon germanium carbon layers in the temperature range from 350° C. to 850° C.

It is a further object of the present invention to provide a method and apparatus for performing polycrystalline deposition of silicon carbon layers in a batch process.

It is a further object of the present invention to provide an apparatus and method for enabling low temperature polycrystalline deposition of silicon carbon layers having very low concentrations of oxygen contaminants in the SiC layers, preferably less than $1 \times 10^{17}$ O atoms cm$^{-3}$.

It is a further object of the present invention to provide an apparatus and method for enabling low temperature deposition of polycrystalline silicon carbon layers in the temperature range from 475° C. to 1200° C.

It is a further object of the present invention to provide a method and apparatus for performing deposition of polycrystalline silicon germanium carbon layers in a batch process.

It is a further object of the present invention to provide an apparatus and method for enabling low temperature deposition of polycrystalline silicon germanium carbon layers having very low concentrations of oxygen contaminants in the SiGeC layers, preferably less than $1 \times 10^{17}$ O atoms cm$^3$.

It is a further object of the present invention to provide an apparatus and method for enabling low temperature deposition of polycrystalline silicon germanium carbon layers in the temperature range from 350° C. to 1200° C.

It is a further object of the present invention to provide a method and apparatus for performing in-situ p- or n-type doping of epitaxial single crystal silicon carbon layers which can withstand furnace anneals to temperatures of 850° C. and rapid thermal anneal temperatures to 1000° C.

It is a further object of the present invention to provide a method and apparatus for performing in-situ p- or n-type doping of polycrystalline silicon carbon layers which can withstand furnace anneals to temperatures of 850° C. and rapid thermal anneal temperatures to 1000° C.

It is a further object of the present invention to provide a method and apparatus for performing in-situ p- or n-type doping of epitaxial single crystal silicon germanium carbon layers which can withstand furnace anneals to temperatures of 850° C. and rapid thermal anneal temperatures to 1000° C.

It is a further object of the present invention to provide a method and apparatus for performing in-situ p- or n-type doping of polycrystalline silicon germanium carbon layers which can withstand furnace anneals to temperatures of 850° C. and rapid thermal anneal temperatures to 1000° C.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

This invention is an apparatus and process for depositing epitaxial single crystal silicon carbon and silicon germanium carbon layers of a desired thickness on a silicon containing substrate, and in particular to provide a process whereby single crystal silicon carbon alloy layers can be epitaxially deposited on a multitude of substrates. These silicon carbon and silicon germanium carbon alloy films are of high crystallographic perfection suitable for device applications and furthermore, can be in-situ doped to any desired levels without any oxygen contamination which is detrimental to device performances. The present invention of growing silicon carbon and silicon germanium carbon films, i.e. SiC, SiC:B, SiC:P, SiGeC, SiGeC:B, SiGeC:P utilizes the UHV-CVD technique for growing epitaxial Si and SiGe films on a silicon containing substrate. For a description of the UHV-CVD growth technique, reference is made to U.S. Pat. No. 5,298,452 which issued Mar. 29, 1994 to B. S. Meyerson and to U.S. Pat. No. 5,906,680 which issued May 25, 1999 to B. S. Meyerson which are incorporated herein by reference. A UHV-CVD reactor suitable for growing the above-mentioned silicon and silicon germanium containing films is available from Unaxis, Switzerland Epigress, Sweden, and CVD Equipment Corp., Ronkonkoma, N.Y., USA.

Figure 1:
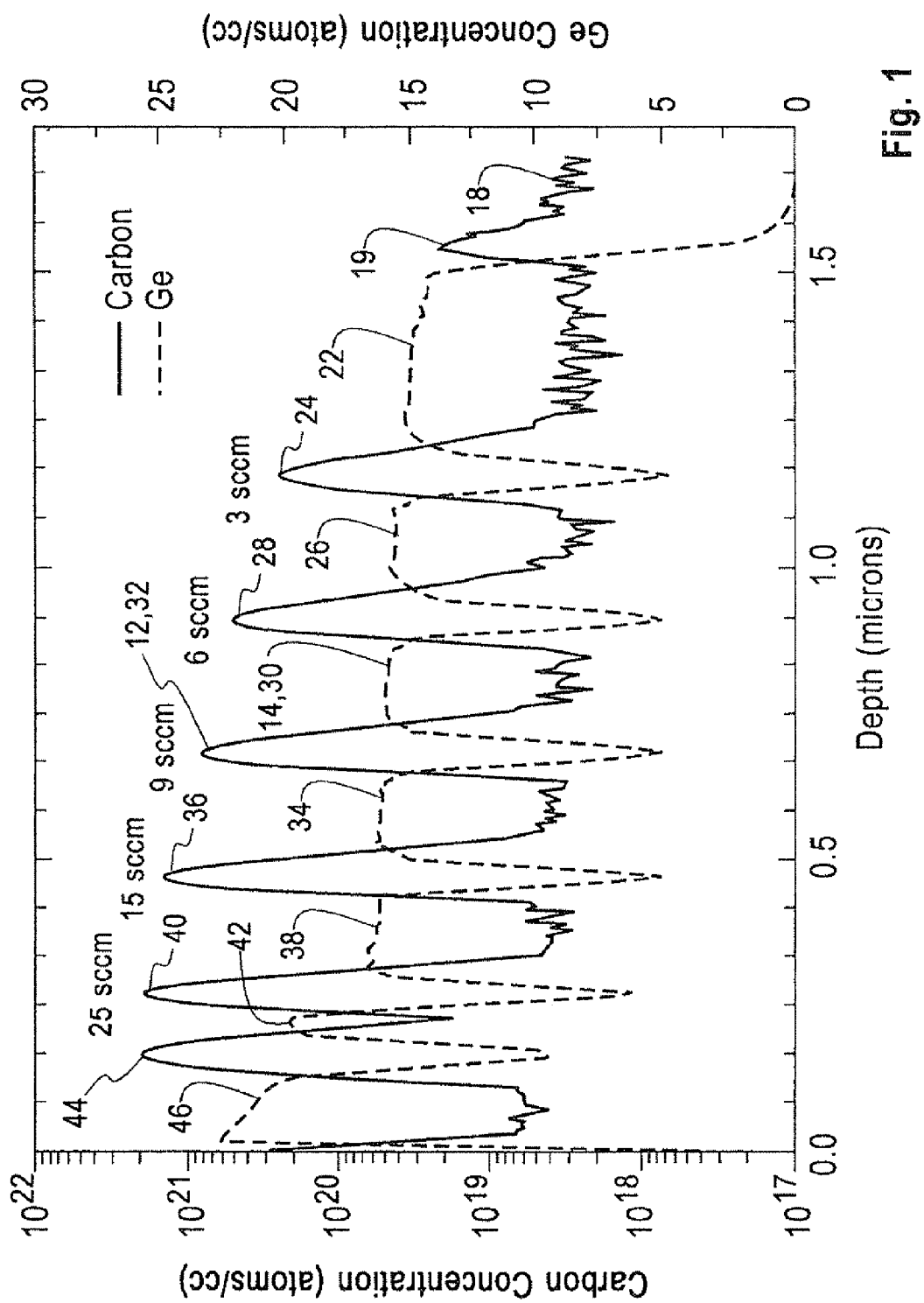
FIG. 1 is a graph of carbon and germanium concentrations versus layer depth as a function of the flow rates of ethylene gas with a constant flow rate of silane.

Referring to the drawing, FIG. 1 shows a graph of the carbon incorporation into silicon during epitaxial growth in a UHV-CVD system. In FIG. 1, the ordinate represents carbon concentration and the abscissa represents depth below the top surface of the final layer. The carbon precursor was ethylene at 2% by volume in a mixture of ethylene ($C_2H_4$) and helium. In FIG. 1, curve 12 represents carbon in the silicon layer and curve 14 represents germanium in the silicon layer. The concentrations of carbon and germanium were measured using a secondary ion mass spectrometry (SIMS) system. Before depositing this film the UHV-CVD system was pumped down to a base pressure below $10^{-8}$ Torr and preferably about $5 \times 10^{-9}$ Torr in the temperature range from 450° C. to 500° C. The surface of the wafers were heated in the range from 475° C. to 850° C. Spacer layers of silicon germanium were grown between periods of introducing carbon into the silicon. The growth temperature for this example was 500 C and the growth pressure was 2-3 millitorr. The resulting germanium spacer regions and silicon carbon layers are shown in FIG. 2 which is a photograph of a cross section TEM view.

Figure 2:
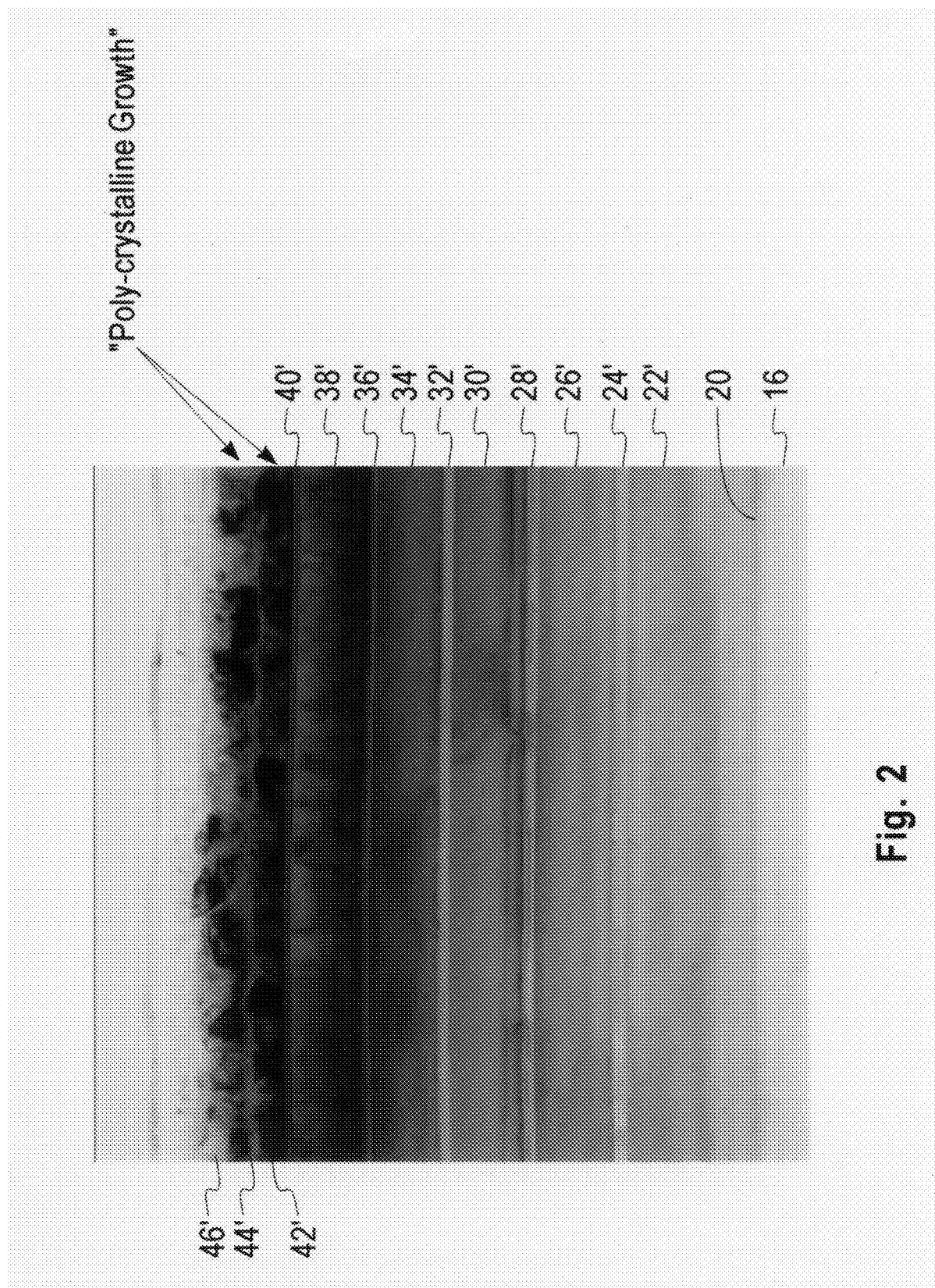
FIG. 2 is a cross section TEM of the layer structure associated with the curves of FIG. 1.

The substrate 16 shown in FIG. 2 has an initial carbon concentration shown by curve portion 18 in FIG. 1, which is determined by the background level of the SIMS characterization system. Curve peak 19 in FIG. 1 is the carbon concentration at the substrate surface 20 prior to forming a silicon layer thereover. The carbon at the surface is due to the residual from the wafer cleaning process which is not removed in the UHV-CVD system due to the absence of a high temperature prebake.

First, a silicon germanium region or layer 22 is grown on surface 20 where the germanium concentration is about 15 atomic % shown by curve portion 22. Next, the germanium precursor is turned off and the ethylene is turned on at a flow of 3 sccm to form silicon carbon. Curve portion 24 shows the concentration of carbon at $2.42 \times 10^{20}$ atoms/cm$^{-3}$. The corresponding layer or region 24' is shown in FIG. 2. The above sequence is repeated to form silicon germanium regions 26, 30, 34, 38 and 42 and carbon regions 28, 32, 36, 40 and 44. A silicon germanium surface cap 46 was formed over carbon region 44. Layers 24, 28, 32 and 36 were epitaxial while layers 40 and 44 had carbon concentrations high enough to form polycrystalline regions. Silicon germanium layers 42 and 46 which are grown on silicon carbon layers 40 and 44 also shows polycrystalline regions associated with layers 40 and 44. The peak carbon concentration levels in regions 24, 28, 32 and 36 increases linearly with a linear increase in carbon precursor flow rate. Carbon regions 24, 28, 32, 36, 40 and 44 were grown at flow rates of ethylene of 3, 6, 9, 15, 25, and 35 sccm, respectively. Peak carbon concentrations of carbon regions 24, 28, 32, 36, 40 and 44 were $2.42\times10^{20}$, $4.97\times10^{20}$, $8.07\times10^{20}$, $1.46\times10^{21}$, $1.94\times10^{21}$, and $2.0\times10^{21}$ atoms cm$^{-3}$, respectively. Carbon regions 24, 28, 32, 36, 40 and 44 has an oxygen concentration which is less than $1\times10^{17}$ atoms cm$^{-3}$ according to SIMS, or below the background level of the SIMS detection system. The low level of oxygen contamination is due to the low initial base pressure in the deposition reactor and the choice of a precursor suitable for the heterogeneous growth process where the chemical reaction occurs on the growth surface. Ethylene as a precursor may be supplied from sources having other hydrocarbon mixtures such as ethane, methane, propane, butane, etc. Background ethylene levels as low as 450 PPM in hydrocarbon mixtures will function as a carbon precursor. In FIG. 2, prime reference numbers show layers corresponding to the curve portions with the same reference numbers in FIG. 1.

Figure 3:
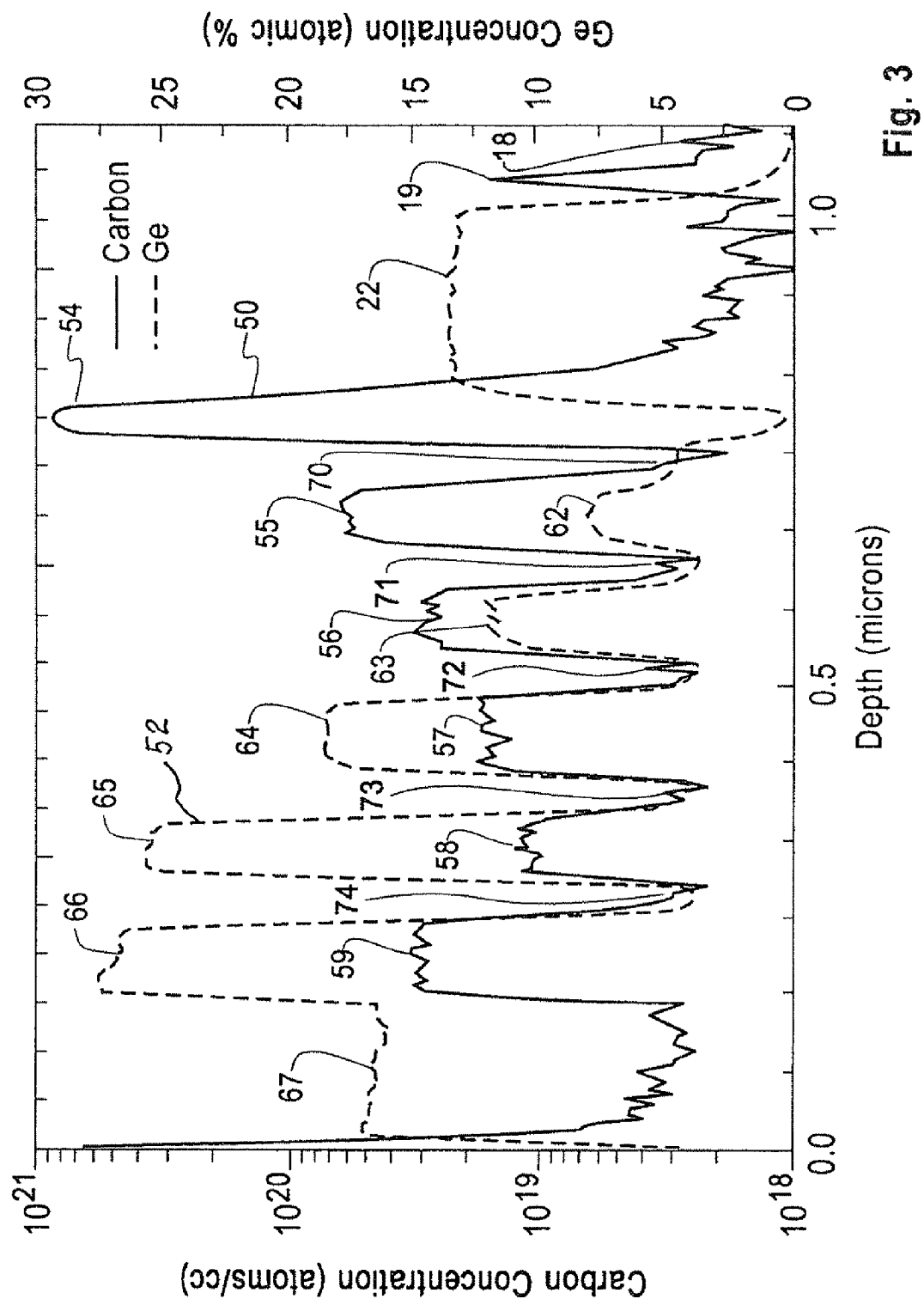
FIG. 3 is a graph of carbon and germanium concentrations versus layer depth as a function of the flow rates of germane with a constant flow rate of silane and ethylene.

FIG. 3 is a graph of carbon concentration versus layer depth as a function of the flow rate of germane with a constant flow rate of silane and ethylene during epitaxial growth in a UHV-CVD system at 500° C. Curve 50 represents carbon concentration and curve 52 represents germanium concentration. In FIG. 3, the ordinate represents carbon concentration and the abscissa represents depth below the final layer surface. The silane flow rate was 30 sccm and the ethylene flow rate was 10 sccm for curve portions 54-58 and 30 sccm for curve portion 59. The ethylene concentration was 2% by volume of a mixture of ethylene and helium. The flow rate of germane was 2.5, 5, 10, 15 and 15 SCCM for curve portions 62-66, respectively. A cap silicon germanium layer is show by curve 67. FIG. 3 shows that increasing the flow of germane results in an increase in growth rate and a decrease of carbon concentration. The inverse incorporation effect of carbon and germanium is similar to that of phosphorous and germanium which is further described in "SiGe Technology: Heteroepitaxy and High-Speed Microelectronics", by P. M. Mooney and J. O. Chu published as chapter 5, pages 335-362 of the book edited by Elton N. Kaufmann and published by Annual Reviews in 2000. However, for layers 65 and 66 deposited at constant germanium flow increasing the ethylene from 10 sccm to 30 sccm results in linear increase the carbon concentration. In FIG. 3, spacer layers 70-74 contained 5% germanium.

Figure 4:
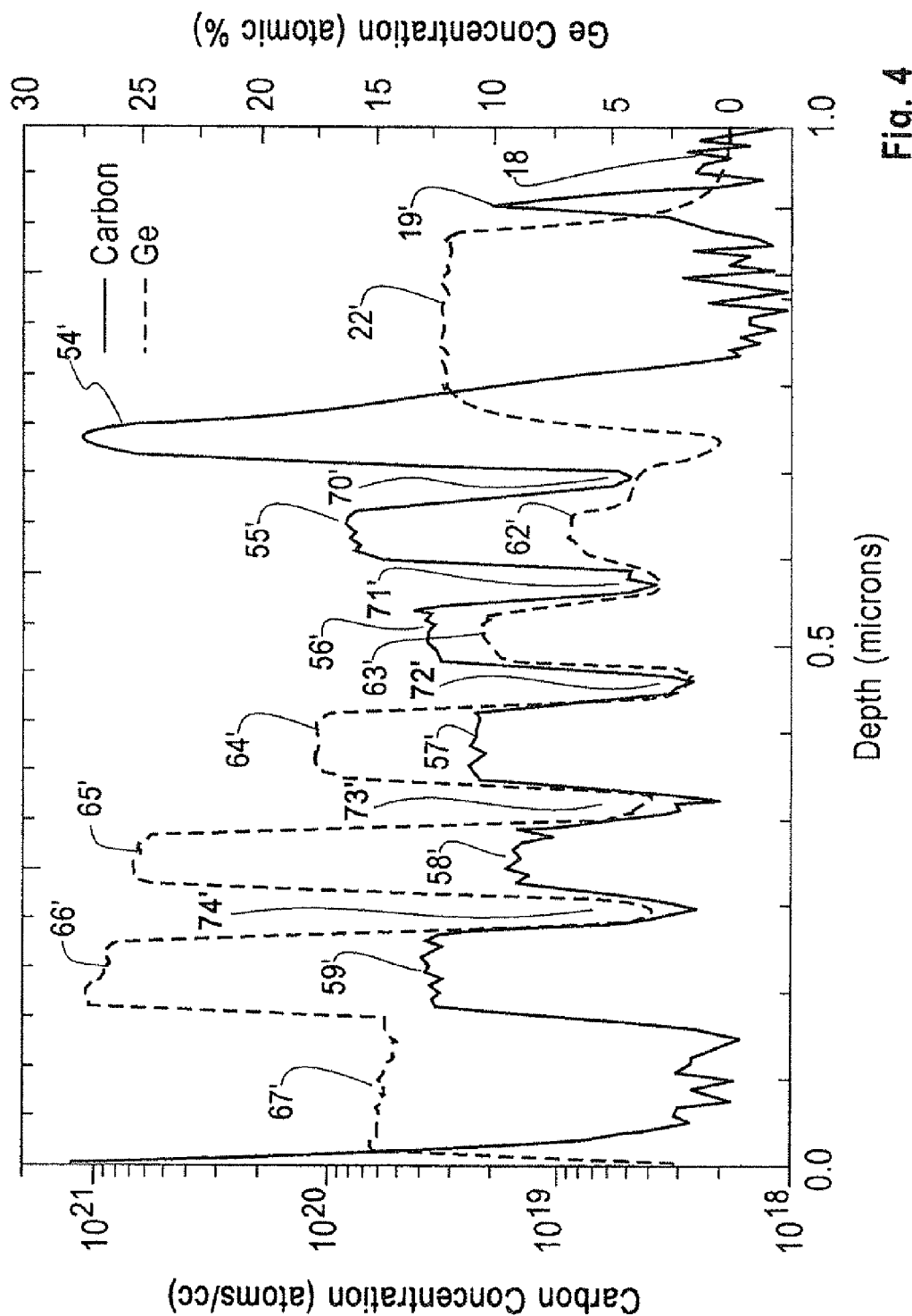
FIG. 4 is a graph of carbon and germanium concentrations versus layer depth as a function of flow rates of germane with a constant flow rate of silane and ethylene.

FIG. 4 is similar to FIG. 3 except that the mixture of ethylene was changed from 2% by volume to 1% by volume of a mixture of ethylene and helium. Curves and curve portions in FIG. 4 have reference numbers which are prime with respect to the corresponding reference numbers in FIG. 3. In FIG. 4, the ordinate represents carbon concentration and the abscissa represents depth below the final layer surface. The silane flow rate was 30 sccm and the 1% ethylene flow rate was 20 sccm for curve portions 54'-58' and 60 sccm for curve portion 59'. The comparison of FIGS. 3 and 4 shows that the inverse incorporation effect of carbon and germanium is independent of concentration of the ethylene mixture. This effect is believed to be due to the poisoning effect of carbon similar to that of phosphine which has an inverse relation to growth rate.

Figure 5:
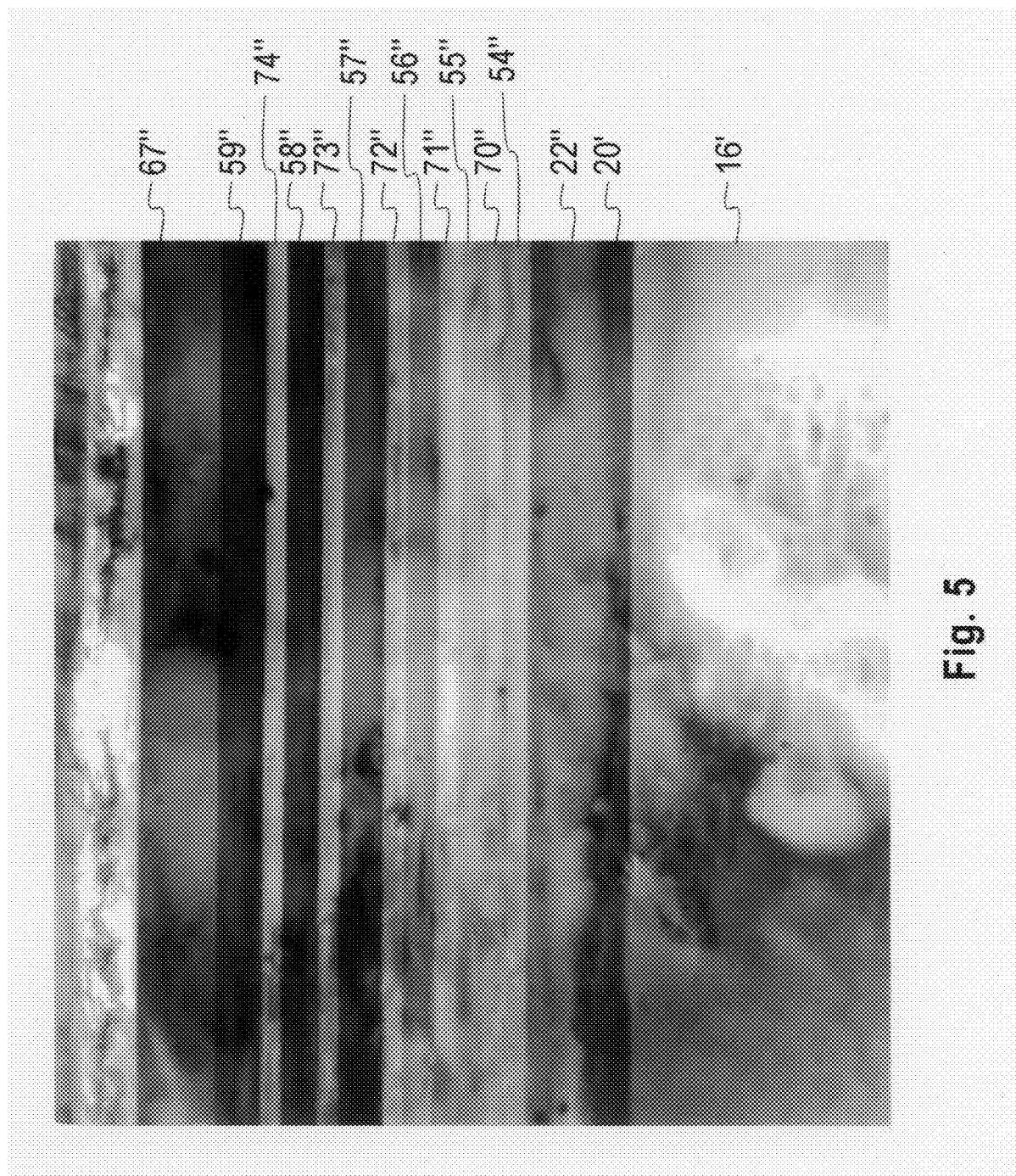
FIG. 5 is a cross section TEM of the layer structure associated with the curves of FIG. 4.

FIG. 5 is a photograph of a cross sectional TEM of the sample discussed in FIG. 4. In FIG. 5 like reference numbers with double primes are used for corresponding curves or curve portions of FIG. 4 with single prime reference numbers. Layers 54"-59" are silicon germanium layers that include carbon incorporated during growth. Layers 54'-59" are all epitaxial single crystal layers. Substrate 16' which may be, for example, silicon has an upper surface 20'.

Figure 6:
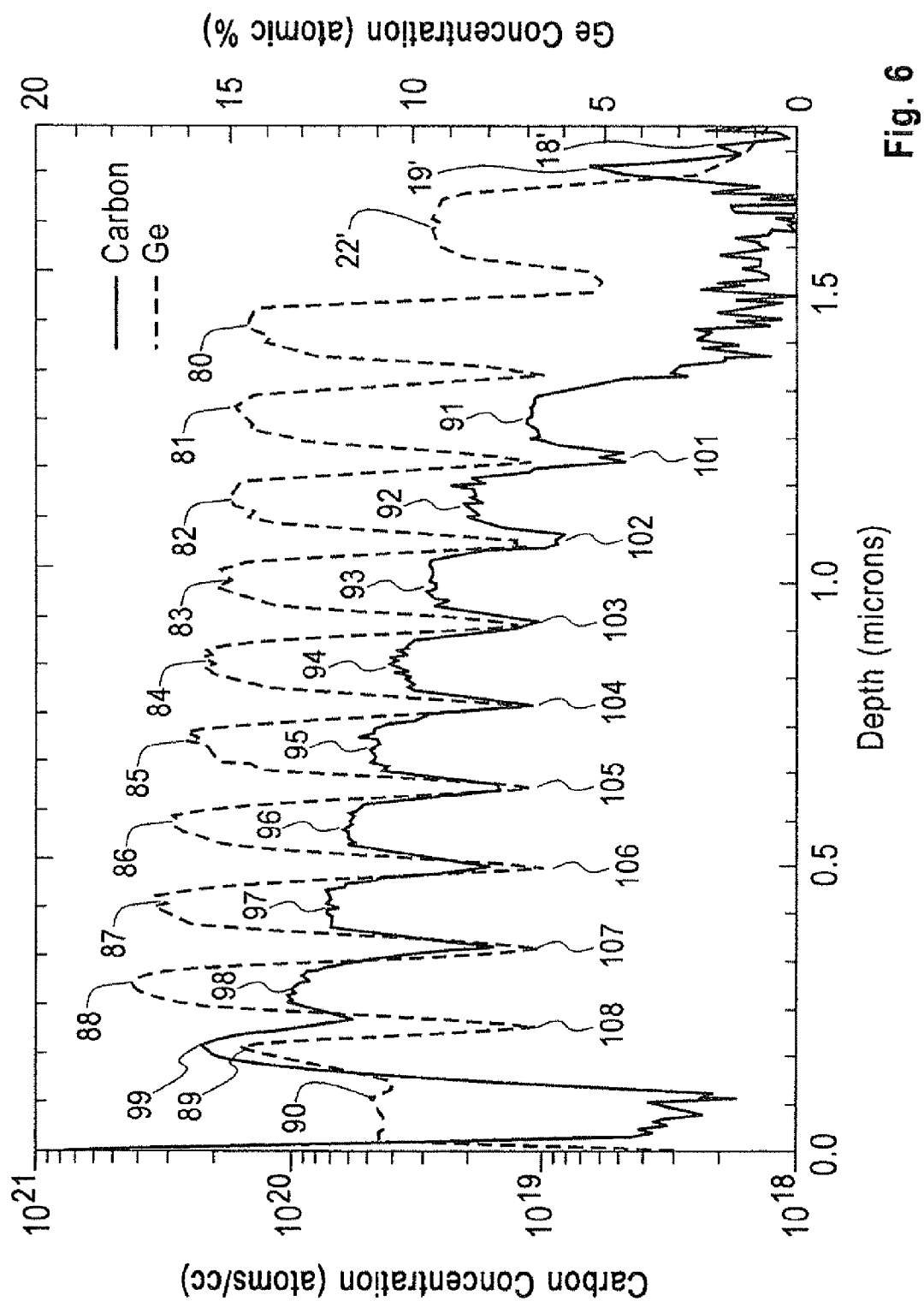
FIG. 6 is a graph of carbon and germanium concentrations versus layer depth as a function of flow rates of ethylene with a constant flow rate of silane and germane.

FIG. 6 is a graph of carbon concentration versus layer depth as a function of flow rates of 2 percent ethylene in a mixture of ethylene and He and with a constant flow rate of silane and germane during epitaxial growth in a UHV-CVD system at 500° C. Germanium regions 80-89, deposited at a constant Ge flow rate, show an increase of germanium concentration caused by the increase of the carbon concentration. Germanium region 80 has no carbon because it was grown in the absence of ethylene, 0 percent at 0 sccm. Carbon regions 91-99 overlay germanium regions 81-89. Carbon regions 91-99 were deposited at ethylene flow rate from 5 to 45 seem in increments of 5 sccm, respectively. Spacer regions 101-108 were formed between carbon regions 91-99 by turning off the ethylene flow and reducing the germane flow rate. Carbon region 98 is starting to form polycrystalline material due to the high carbon concentration of about $1\times10^{20}$ atoms cm$^{-3}$. Carbon region 99 has a peak concentration of about $2\times10^{20}$ atoms cm$^{-3}$. Carbon region 99 causes a decrease in the germanium concentration as shown by curve 98 and forms polycrystalline regions.

Figure 7:
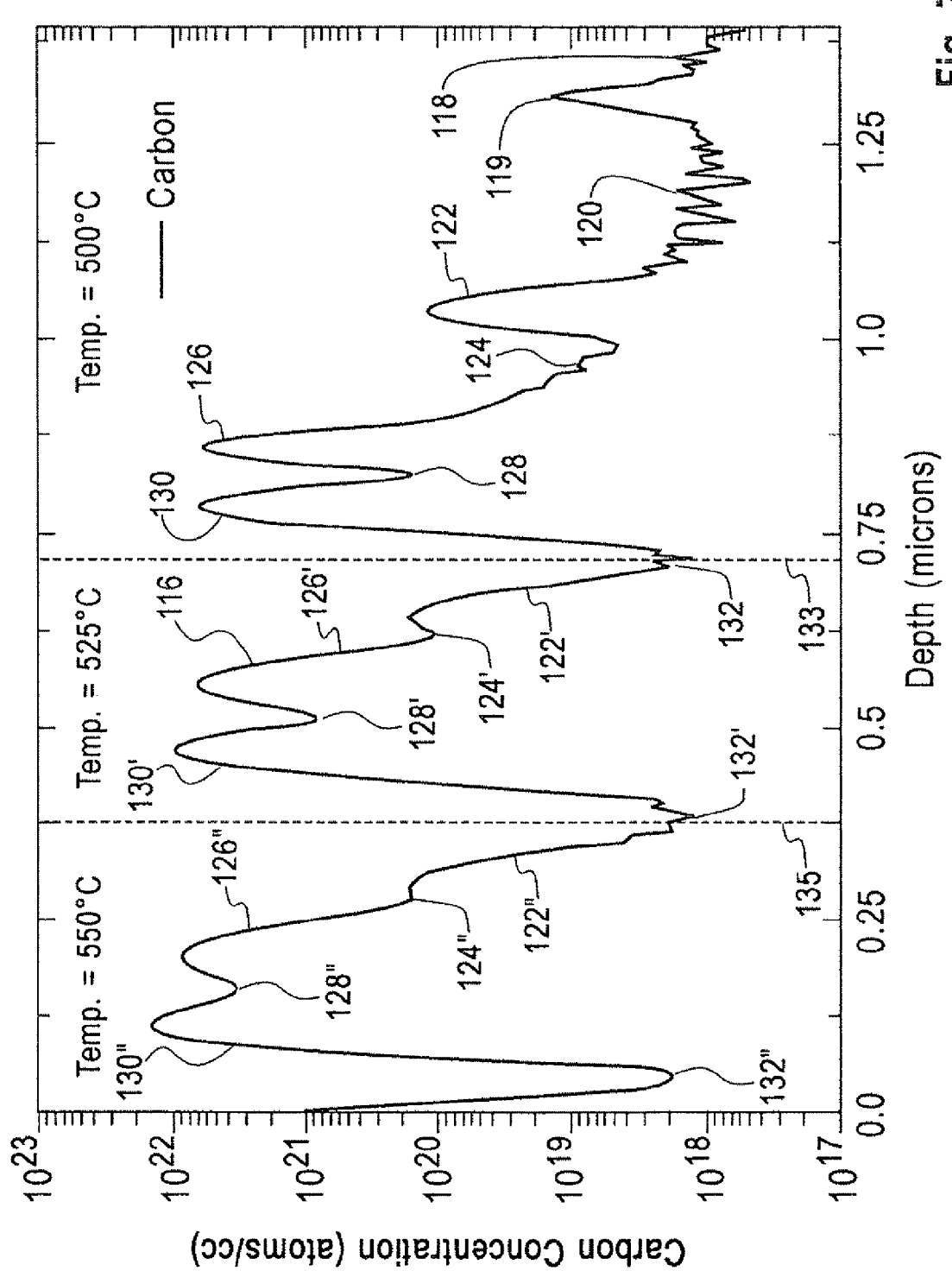
FIG. 7 is a graph of carbon concentration versus layer depth as a function of ethylene and ethane flows at several deposition temperatures.

FIG. 7 is a graph of carbon concentration versus layer depth as a function of flow rates of ethylene and ethane with a constant flow rate of silane during epitaxial growth in a UHV-CVD system at several deposition temperatures. In FIG. 7, the ordinate represents carbon concentration and the abscissa represents depth below the top surface. Curve 116 shows the carbon concentration in the film as a function of depth. Curve portion 118 shows the background carbon concentration which is similar to curve portion 18" in FIG. 6. Curve portion 119 shows the background carbon concentration at the initial substrate surface prior to forming a silicon layer thereover. Curve portion 120 shows silicon growth without carbon. Curve portion 122 shows carbon doped silicon growth where the growth conditions are: UHV-CVD and substrate temperature 500° C., silane flow rate equals 30 sccm, ethane flow rate equals 50 sccm where ethane is 10% of a mixture of ethane and helium, the mixture also includes a background content of 450 ppm ethylene and the pressure is about 2-3 millitorr. The 10 percent mixture of ethane has a purity level of ethane of 99 percent. This low amount of ethylene is still enough to enable carbon to be incorporated into the growing silicon layer. The ethane and 450 ppm ethylene is turned off which is shown in curve portion 124. Curve portion 126 shows the same silane flow but the ethylene is turned on at a flow rate of 3 sccm of 100% ethylene. The 100 percent mixture of ethylene has a purity level of ethylene of 99.95 percent. Curve portion 128 shows the carbon concentration where the ethylene is turned off. Curve portion 130 shows where ethylene is turned on with a flow rate of 5 sccm of 100% ethylene. Curve portions 130 and 126 show a peak carbon concentration of $7\times10^{21}$ atoms cm$^{-3}$. Curve portion 122 shows a peak carbon concentration of about $1\times10^{20}$ atoms cm$^{-3}$. Even small concentrations such as 450 ppm can function to incorporate carbon into the silicon film showing that ethylene is the active precursor for incorporating carbon.

In Curve portion 132 the ethylene is turned off and at reference line 133, the temperature is increased from 500° C. to 525° C. After reference line 133, the growth conditions beginning with curve portion 122 are repeated as shown by curve portions 122' to 130' at 525° C. At reference line 135, the temperature is increased from 525° C. to 550° C. After reference line 135, the growth conditions beginning with curve portion 122 are repeated as shown by curve portions 122" to 130" at 550° C. Regardless of the temperature, the small concentrations of ethylene associated with the ethane mixture still shows carbon incorporation indicating that ethylene is the active precursor.

Figure 8:
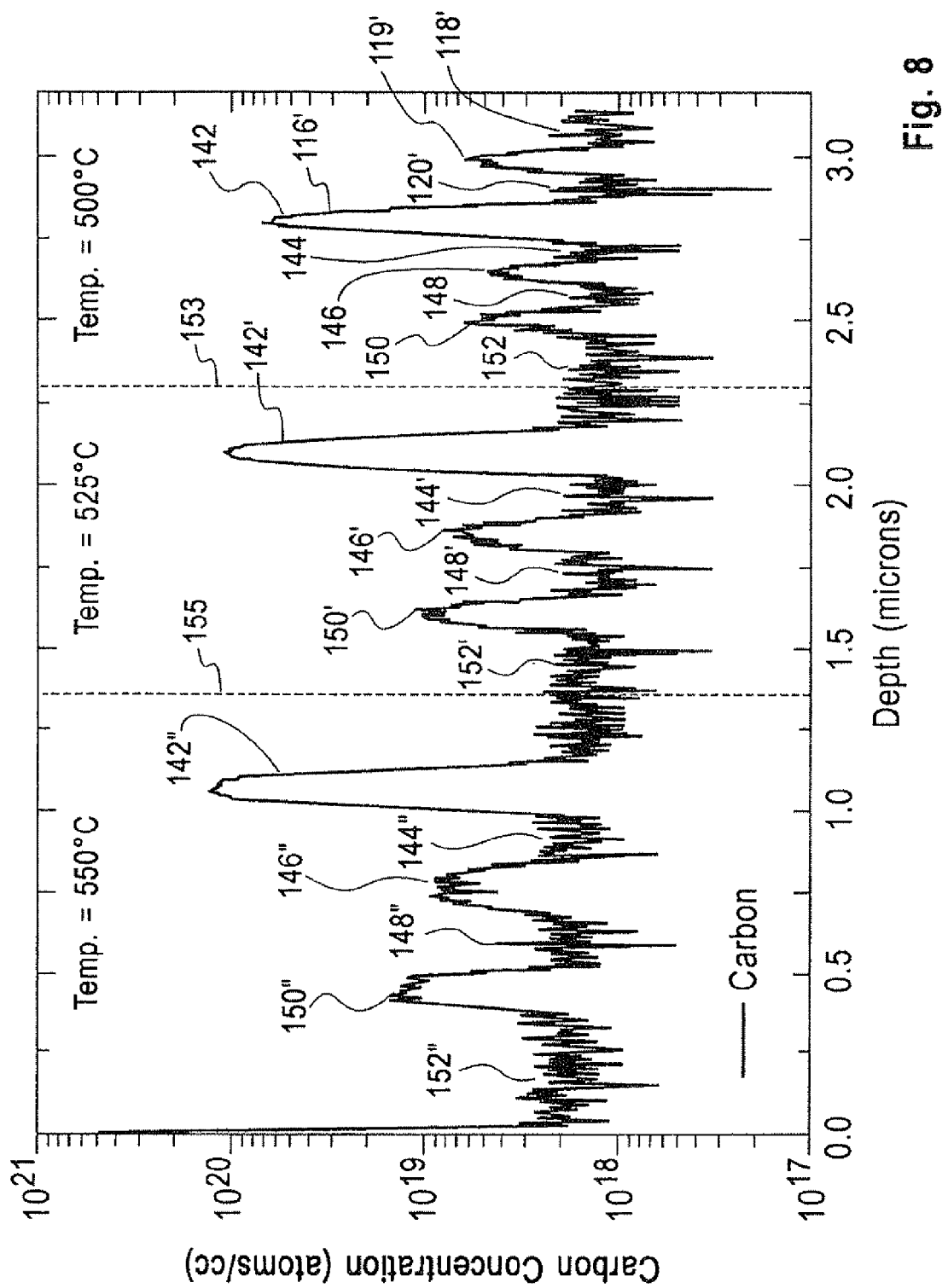
FIG. 8 is a graph of carbon concentration versus layer depth as a function of two mixtures of ethane at several deposition temperatures.

FIG. 8 is a graph of carbon concentration versus layer depth as a function of 10% and 50% concentration of ethane in helium at several deposition temperatures. The 10% mixture has a purity level of ethane of 99% and the 50% mixture has a purity level of ethane of 99.95%. In FIG. 8, the ordinate represents carbon concentration and the abscissa represents depth below the top surface. Curve 116' shows the carbon concentration in the film as a function of depth. Curve portion 118' shows the background carbon concentration which is similar to curve portion 118 in FIG. 7 and curve 18" in FIG. 6. Curve portion 119' shows the background carbon concentration at the initial substrate surface prior to forming a silicon layer thereover. Curve portion 120' represents silicon growth without carbon. Curve portion 142 shows carbon doped silicon growth where the growth conditions are: UHV-CVD chamber and substrate temperature 500° C., silane flow rate equals 30 sccm, ethane flow rate equals 50 sccm where ethane is 10% of a mixture of ethane and helium, the mixture also includes a background content of 450 ppm ethylene and the pressure is about 2-3 millitorr. This low amount of ethylene is still enough to enable carbon to be incorporated into the growing silicon layer. The ethane and ethylene is turned off which is shown in curve portion 144. Curve portion 146 shows the same silane flow but the ethane is turned on at a flow rate of 50 sccm of 50% ethane in a mixture of ethane and helium. Curve portion 148 shows the carbon concentration where the ethane is turned off. Curve portion 150' shows where ethane is turned on with a flow rate of 90 sccm of 50% ethane in a mixture of ethane and helium. Curve portion 150 shows a peak carbon concentration of $6 \times 10^{18}$ atoms $cm^{-3}$. Curve portion 146 shows a peak carbon concentration of $4.5 \times 10^{18}$ atoms $cm^{-3}$. Curve portion 142 shows a peak carbon concentration of about $7 \times 10^{19}$ atoms $cm^{-3}$. Curve 146 and 150 result from the 50% ethane concentration while curve 142 results from the 10% ethane concentration. If ethane was a contributing agent to the carbon incorporation, then one would expect curves 146 and 150 to be higher than curve 142. FIG. 8 shows that ethane is not a precursor for carbon incorporation even though it provides a lot of carbon in the gas. Even small concentrations of ethylene such as 450 ppm can function to incorporate carbon into the silicon film showing that ethylene is the active precursor for incorporating carbon. A gas analysis of 10% ethane showed 450 ppm of ethylene as background gas or contaminate.

In curve portion 152, the ethane is turned off and at reference line 153, the temperature is increased from 500° C. to 525° C. After reference line 153, the growth conditions beginning with curve portion 142' are repeated as shown by curve portions 142', 144', 146', 148', 150' and 152' at 525 C. At reference line 155, the temperature is increased from 525° C. to 550° C. After reference line 155, the growth conditions beginning with curve portion 142' are repeated as shown by curve portions 142", 144", 146", 148", 150" and 152" at 550° C. Regardless of the temperature, the concentrations of 50% ethane associated with the ethane mixture still shows less carbon incorporation than the 10% ethane indicating that ethylene (450 ppm in the 10% ethane as measured) is the active precursor.

Figure 9:
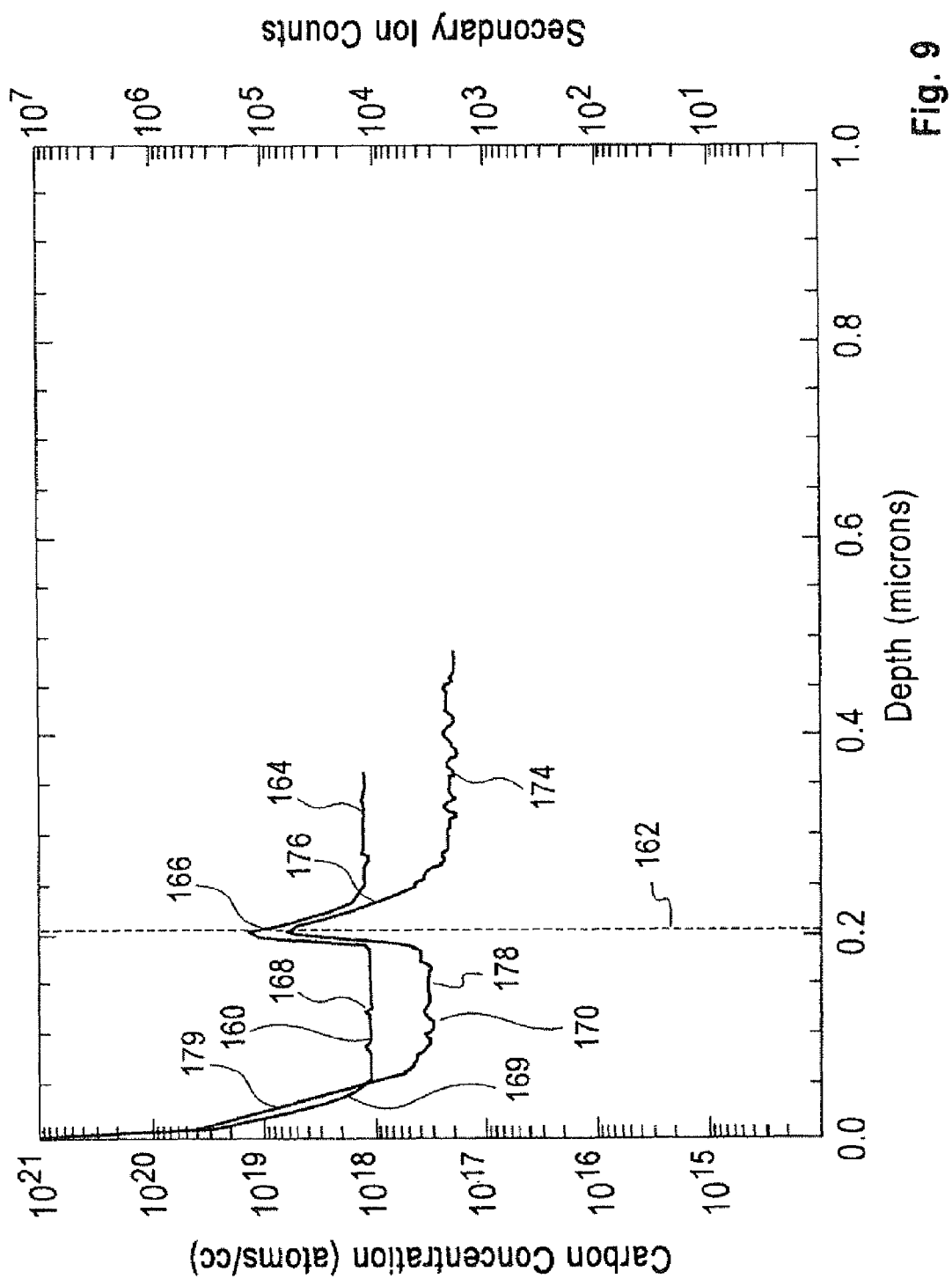
FIG. 9 is a graph of the carbon and oxygen concentrations in a silicon layer grown after growing multiple layers of carbon doped silicon and carbon doped silicon germanium such as shown in FIGS. 1, 3, 4 and 6.

FIG. 9 is a graph of the carbon and oxygen concentrations in a silicon layer grown after growing multiple layers of carbon doped silicon and carbon doped silicon germanium such as shown in FIGS. 1, 3, 4 and 6. The carbon source used in FIGS. 1, 3, 4 and 6 was ethylene. In FIG. 9, the left ordinate represents concentration and the abscissa represents depth of the film below the top surface. The right ordinate represents secondary ion counts. Curve 160 shows the oxygen concentration as a function of depth. A silicon substrate has an upper surface at about 0.2 microns depth as shown by reference line 162. Curve portion 164 represents the ambient oxygen concentration in the substrate which is $1 \times 10^{18}$ atoms cm-3. Curve portion 166 represents the oxygen at the silicon substrate interface formed by an epitaxial silicon layer grown on the substrate. The peak oxygen of curve portion 166 was $1 \times 10^{19}$ atoms cm-3. Curve portion 168 shows the oxygen concentration in the silicon layer which is about $1 \times 10^{18}$ atoms cm-3. Curve portion 169 shows an apparent increase of oxygen concentration near the silicon layer surface due to the presence of a native oxide. The SIMS tool uses a Cs+ as the sputtering beam.

Curve 170 shows the carbon concentration as a function of depth. Curve portion 174 represents the ambient carbon concentration in the substrate which is $2 \times 10^{17}$ atoms cm-3. Curve portion 176 represents the carbon at the silicon substrate interface formed by an epitaxial silicon layer grown on the substrate. The peak carbon concentration of curve portion 166 was $5 \times 10^{18}$ atoms cm-3. Curve portion 178 shows the carbon concentration in the silicon layer which is about $3 \times 10^{17}$ atoms cm-3. Curve portion 179 shows an apparent increase of carbon concentration near the silicon layer surface due to the presence of contaminants from the chamber ambient and residuals from the wafer cleaning process. The SIMS tool uses a Cs+ beam as the sputtering source.

FIG. 9 shows that there is no further oxygen or carbon contaminations from the earlier use of the ethylene precursor or any associated mixtures of ethylene. The UHV-CVD chamber remains operational (having no background carbon and a base pressure of less than $10^{-9}$ Torr.) with respect to the background contaminates to enable further growth of epitaxial silicon or silicon germanium layers as described in U.S. Pat. No. 5,298,452 by Meyerson which issued Mar. 29, 1994. Carbon may be incorporated into silicon layers or silicon germanium only due to the ethylene precursor gas and where no carbon incorporates into the layer from the background. When the flow of the ethylene precursor gas is turned off, there is no carbon or oxygen memory effect i.e. no continued incorporation of carbon.

The fact that there is no memory effect, is substantiated by the laboratory data given in Table 1. Table 1 provides data via SIMS measurements taken from 14 samples.

TABLE 1

| Date | C and O Baselines for Hex Tool 349, Mostly March-May 2000 Referenced to standard "li" which is similar to YKT 3/00 C/O | Interface C/cm2 | Interface O/cm2 | C/cm3 in epi |
|---|---|---|---|---|
| 1/00 | PR952-12 Run21431E72-UMCA revisit | 3.9E12 | 1.9E12 | 1.1E17 |
| 3/02 | CP1057-Run247 UHVA | 2.7E12 | 6.0E11 | — |
| 3/02 | CP1057-Run255 SSDA | 2.6E12 | 1.9E12 | 1.1E17 |
| 3/02 | CP1057-Run258 | 5.5E12 | 1.1E13 | 1.4E17 |
| 3/02 | CP1057-Run262 SSOA | 1.4E13 | 2.4E13 | 1.4E17 |
| Mar. 31, 2000 | CP1126-Run302 Slot5 After Recovery | 6.0E12 | 1.1E13 | 1.5E17 |
| Mar. 31, 2000 | CP1126 Run302 Slot8 after recovery | 6.0E12 | 7.6E12 | 1.5E17 |
| 4/4 | CP1135 Run310 Slot8 FILTER IN PLACE, Ethylene run | 3.0E12 | 1.3E12 | 1.1E17 |
| 4/24 | CP1178-2 Run 324 after ethylene runs | 3E12 | 4E12 | 1.0E17 |

TABLE 1-continued

| Date | C and O Baselines for Hex Tool 349, Mostly March-May 2000 Referenced to standard "li" which is similar to YKT 3/00 C/O | Interface C/cm2 | Interface O/cm2 | C/cm3 in epi |
|---|---|---|---|---|
| 5/2 | CP1197-Run333 Control Run after ethylene runs | 5.4E12 | 1.2E13 | 1.5E17 |
| 5/14 | CP1232 run after ethylene runs | 5.4E12 | 9E12 | 1.2E17 |
| 6/8 | CP 1314 - Run 376 after ethylene run | 1e13 | 1.2e13 | 1.4e17 |
|  | CP-1314 Run 378? | 1.5E13 | 1.9E13 | 1.4E17 |
| 6/15 | CP 13124 - Run 380 after the ethylene run | 1.4E13 | 2.0E13 | 1.3E17 |

In the first column of Table 1, 14 different days over six months were used for growing a silicon film on a substrate similar to the silicon layer grown on a substrate as described in FIG. 9. Column 2 gives a short description of the sample name and sample number run. The samples were run in a common tool, Sirus manufactured by Leybold now Unaxis. Column 3 shows data of carbon at the silicon layer interface corresponding to curve portion 176 in FIG. 9. Column 4 shows data of oxygen at the silicon layer interface corresponding to curve portion 166 in FIG. 9. Column 5 shows data of the carbon concentration in the silicon containing layer corresponding to curve portion 178. The data in columns 3-5 are within acceptable ranges or criteria for growing epitaxial silicon containing layers by UHV-CVD.

Figure 10:
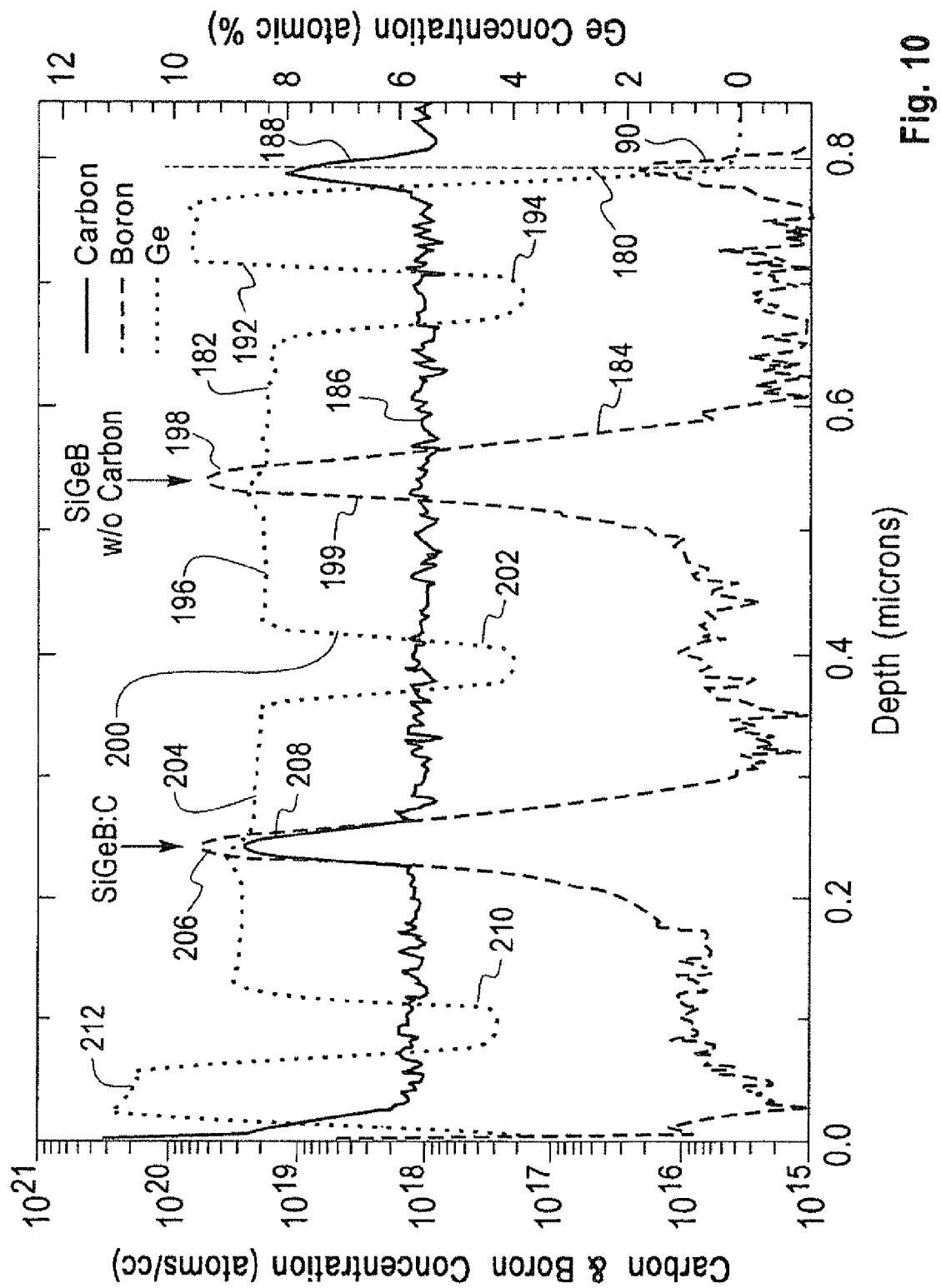
FIG. 10 is a graph of germanium, carbon and boron concentrations in a silicon and/or silicon germanium layer as a function of depth.

FIG. 10 is a graph of SIMS data as a function of depth taken from silicon containing layers grown by UHV CVD with various concentrations of germanium, carbon and boron incorporated therein. The growth of the layers were formed in a continuous process without interruption or breaking vacuum. The growth conditions were at 550 C. The word "layer" as used is a general term to denote a region of growth with a concentration above and/or below a predetermined value. In FIG. 10, the left ordinate represents respective carbon or boron concentration in atom/cc and the right ordinate represents germanium concentration in atomic percent. The abscissa represents depth in microns below the top surface of the final layer. An initial silicon substrate was used for growing epitaxial silicon containing layers thereon. The silicon substrate had a top surface which is now at a depth of about 0.79 microns shown by reference line 180 in FIG. 10.

In FIG. 10, the germanium concentration is shown by curve 182, the boron concentration is shown by curve 184; and the carbon concentration is shown by curve 186. At the interface of the silicon substrate and the silicon containing layer an increase in carbon is shown by curve portion 188 and an increase of boron is shown by curve portion 190. First on the upper surface of the substrate, a layer of silicon with germanium was grown with a germanium concentration of about 9 atomic percent as shown by curve region 192. In the layer of curve region 192, the concentration of boron and carbon was due to background contamination. Next, the Ge precursor was turned off as shown by curve portion 194 where the Ge concentration decreased to about 4 atomic percent. The Ge precursor was turned on again to provide curve portion 196 with a Ge concentration of about 8.2 percent. In the middle of curve portion 196, the boron precursor was turned on to provide a peak in B of about $4.5 \times 10^{19}$ atoms/cc shown by curve portion 198. It is noted that the carbon concentration remained the same and that a layer of SiGeB had been formed with the Ge concentration at about 8.2 percent. The B precursor was turned off as shown by curve portion 199 and then the Ge precursor gas was turned off as shown by curve portion 200.

A substantially Si layer was grown at curve portion 202 where the Ge concentration was about 4 percent. The Ge precursor was turned on again as shown by curve portion 204. In the middle of curve portion 204, the boron precursor and the carbon precursor gases were tuned on as shown by respective curve portions 206 and 208. The carbon precursor gas was $C_2H_4$. The boron precursor and the carbon precursor gases were then turned off. Thus a SiGeB:C layer was grown at the depth of curve portions 206 and 208. Then the Ge precursor gas was turned off as shown by curve portion 210 where a substantially silicon layer was grown with a Ge concentration of about 4 atomic percent. The Ge precursor gas was turned on again as shown by curve portion 212 and then turned off again. At the top surface, the carbon concentration and boron concentration increased due to contamination. In summary, FIG. 10 shows two buried SiGe layers in silicon at the depths of curve portions 192 and 212, a SiGeB layer without C at the depth of curve portion 198 with a SiGe layer on both sides and a SiGeB:C layer at the depth of curve portions 206 and 208 with a SiGe layer on both sides.

Figure 11:
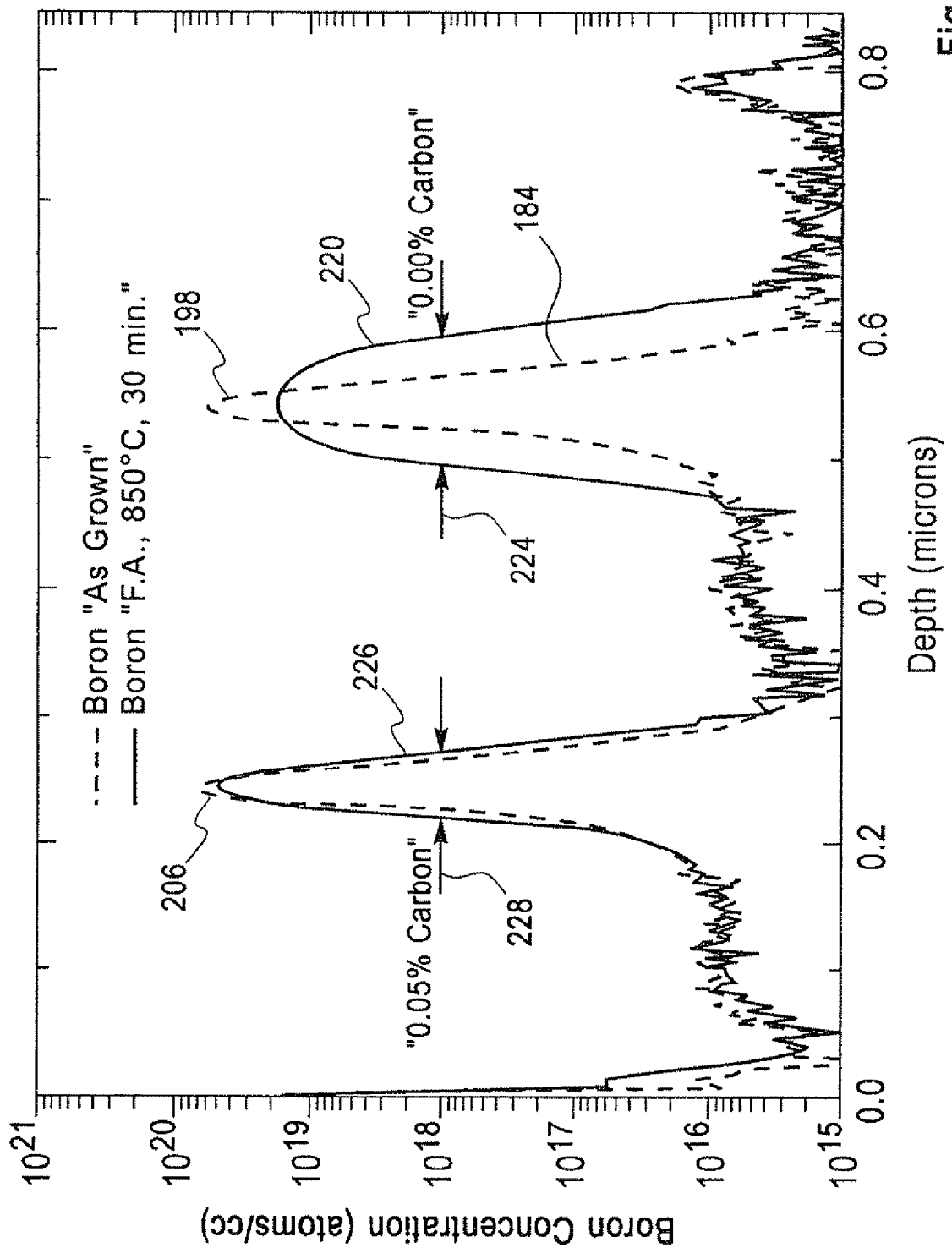
FIG. 11 is a graph of the boron concentration in a silicon germanium layer as a function of depth after furnace anneal with the curve of carbon concentration as a function of depth prior to furnace anneal reproduced from FIG. 10.

FIG. 11 shows the results of SIMS measurements of boron after the sample having the concentration profiles of FIG. 10 is subject to a furnace anneal at 850° C. for 30 minutes. In FIG. 11, the ordinate on the left hand side represents Boron concentration in atoms/cc. The abscissa represents depth below the surface in microns. In FIG. 11, the ordinate and abscissa are the same as the left ordinate and abscissa respectively in FIG. 10. Curve 184 from FIG. 10 is reproduced in FIG. 11. Curve 220 shows the boron concentration profile of the sample measured after the furnace anneal at 850° C. for 30 minutes. Curve portion 222 has about 2.4 times the width at $10 \times 10^{18}$ atoms/cc as curve portion 198 as shown by arrow 224. Curve portion 226 has about 1.35 times the width at $10 \times 10^{18}$ atoms/cc as curve portion 206 as shown by arrow 228. The presence of carbon at the same depth as curve portion 206 where the carbon was about 0.05 percent ($2.5 \times 10^{19}$ atoms/cc) is believed to block the boron from diffusing during furnace anneal at 850° C. for 30 minutes. The carbon is believed to occupy the substitutional sites in the silicon germanium crystal lattice and thus block boron from diffusing by way of substitutional sites. As shown in FIG. 11, there is a measurable difference in the out-diffusion of boron in SiGe with C present (0.05 percent) as compared to the out-diffusion of boron in SiGe where C is not present (0.00 percent). Preservation, of the original grown B profile in Si and SiGe layers is important to obtain superior device structures such as FET and bipolar transistors.

U.S. patent application Ser. No. 09/774,126 filed Jan. 30, 2001 by Chu et al. entitled "Incorporation of Carbon in Silicon/Silicon Germanium epitaxial layer to Enhance Yield for Si—Ge bipolar technology" referred to above is directed to a method of fabricating a SiGe bipolar transistor including carbon in the collector region as well as the SiGe base region and is assigned to the assignee herein and incorporated herein by reference.

While there has been described and illustrated a method and structure for incorporating carbon into silicon and silicon germanium layers with or without in-situ doping and with abrupt concentration profiles and with low levels of oxygen, it will be apparent to those skilled in the art that modifications and variations are possible without deviating from the broad scope of the invention which shall be limited solely by the scope of the claims appended hereto.

What is claimed is:

1. A layered structure comprising:
   a substrate having an upper surface of single crystalline Si, and
   a layer of SiGeC over said upper surface,
   said Si/SiGeC layer interface having an abrupt change in C concentration above $1\times10^{18}$ atoms/cc over a layer thickness in the range from about 6 Å to about 60 Å,
   and wherein the oxygen in said SiGeC layer is less than $1\times10^{17}$ atoms/cc.

2. The layered structure of claim 1 wherein said SiGeC layer is single crystalline.

3. The layered structure of claim 1 wherein said SiGeC layer is polycrystalline.

4. The layered structure of claim 1 further including a layer of Si over said layer of SiGeC, said SiGeC/Si layer interface having an abrupt change in C concentration above $1\times10^{18}$ atoms/cc over a layer thickness in the range from about 6 Å to about 60 Å and wherein the oxygen in said Si layer is less than $1\times10^{17}$ atoms/cc.

5. The layered structure of claim 1 wherein said layer of SiGeC includes a p-type dopant in the range from about $1\times10^{18}$ to about $1\times10^{21}$ atoms/cc and wherein said p-type dopant profile can withstand furnace anneals to temperatures of 850° C. and rapid thermal anneal temperatures to 1000° C.

6. The layered structure of claim 1 wherein said layer of SiGeC includes a n-type dopant in the range from about $1\times10^{18}$ to about $1\times10^{21}$ atoms/cc.

7. The layered structure of claim 5 further including a layer of Si over said layer of p-type doped SiGeC, said p-type doped SiGeC/Si layer interface having an abrupt change in C concentration above $1\times10^{18}$ atoms/cc over a layer thickness in the range from about 6 Å to about 60 Å and wherein the oxygen in said Si layer is less than $1\times10^{17}$ atoms/cc.

8. The layered structure of claim 7 wherein said p-type doped SiGeC/Si layer interface having an abrupt change in dopant concentration above $1\times10^{18}$ atoms/cc over a layer thickness in the range from about 6 Å to about 60 Å.

9. The layered structure of claim 6 further including a layer of Si over said layer of n-type doped SiGeC, said n-type doped SiGeC/Si layer interface having an abrupt change in C concentration above $1\times10^{18}$ atoms/cc over a layer thickness in the range from about 6 Å to about 60 Å and wherein the oxygen in said Si layer is less than $1\times10^{17}$ atoms/cc.

10. The layered structure of claim 9 wherein said n-type doped SiGeC/Si layer interface having an abrupt change in dopant concentration above $1\times10^{18}$ atoms/cc over a layer thickness in the range from about 6 Å to about 60 Å.

11. The layered structure of claim 1 further including a layer of SiGe over said layer of SiGeC, said SiGeC/SiGe layer interface having an abrupt change in C concentration above $1\times10^{18}$ atoms/cc over a layer thickness in the range from about 6 Å to about 60 Å and wherein the oxygen in said SiGe layer is less than $1\times10^{17}$ atoms/cc.

12. The layered structure of claim 5 further including a layer of SiGe over said layer of p-type doped SiGeC, said p-type doped SiGeC/SiGe layer interface having an abrupt change in C concentration above $1\times10^{18}$ atoms/cc over a layer thickness in the range from about 6 Å to about 60 Å and wherein the oxygen in said SiGe layer is less than $1\times10^{17}$ atoms/cc.

13. The layered structure of claim 6 further including a layer of SiGe over said layer of n-type doped SiGeC, said n-type doped SiGeC/SiGe layer interface having an abrupt change in C concentration above $1\times10^{18}$ atoms/cc over a layer thickness in the range from about 6 Å to about 60 Å and wherein the oxygen in said SiGe layer is less than $1\times10^{17}$ atoms/cc.

14. A layered structure comprising:
   a substrate having an upper surface of single crystalline Si, and
   a multitude of layers of materials selected from the group consisting of Si, SiGe, SiC, and SiGeC over said upper surface,
   said Si/SiC, Si/SiGeC, SiGe/SiC and SiGe/SiGeC layer interfaces having an abrupt change in C concentration above $1\times10^{18}$ atoms/cc over a layer thickness in the range from about 6 Å to about 60 Å,
   and wherein the oxygen in said carbon containing layer is less than $1\times10^{17}$ atoms/cc.

15. The layered structure of claim 14 wherein said layers are single crystalline.

16. The layered structure of claim 14 wherein said layers are polycrystalline.

17. The layered structure of claim 14 wherein said carbon containing layers include a p-type dopant in the range from about $1\times10^{18}$ to about $1\times10^{21}$ atoms/cc and wherein said p-type dopant profile can withstand furnace anneals to temperatures of 850° C. and rapid thermal anneal temperatures to 1000° C.

18. The layered structure of claim 14 wherein said carbon containing layers include a n-type dopant in the range from about $1\times10^{18}$ to about $1\times10^{21}$ atoms/cc.

* * * * *